US007041151B2

(12) United States Patent
Gaur et al.

(10) Patent No.: US 7,041,151 B2
(45) Date of Patent: May 9, 2006

(54) ELECTROCHEMICAL DISPLACEMENT-DEPOSITION METHOD FOR MAKING COMPOSITE METAL POWDERS

(75) Inventors: Raj Pal Singh Gaur, Athens, PA (US); Scott A. Braymiller, Troy, PA (US); Thomas A. Wolfe, Towanda, PA (US); Michael R. Pierce, Towanda, PA (US); David L. Houck, Towanda, PA (US)

(73) Assignee: Osram Sylvania Inc., Danvers, MA (US)

( * ) Notice: Subject to any disclaimer, the term of this patent is extended or adjusted under 35 U.S.C. 154(b) by 317 days.

(21) Appl. No.: 10/760,667

(22) Filed: Jan. 20, 2004

(65) Prior Publication Data

US 2004/0149085 A1 Aug. 5, 2004

Related U.S. Application Data

(60) Provisional application No. 60/441,454, filed on Jan. 21, 2003.

(51) Int. Cl.
*B22F 9/24* (2006.01)
(52) U.S. Cl. .............................. 75/351; 75/371; 75/373
(58) Field of Classification Search ................... 75/351, 75/371, 373
See application file for complete search history.

(56) References Cited

U.S. PATENT DOCUMENTS

| 3,382,066 | A |   | 5/1968 | Kenney et al. ............... 419/22 |
| 4,221,828 | A |   | 9/1980 | Sato et al. .................. 427/217 |
| 4,243,728 | A |   | 1/1981 | Sato et al. .................. 428/570 |
| 4,309,457 | A |   | 1/1982 | Kawasumi et al. ......... 427/214 |
| 4,309,458 | A |   | 1/1982 | Kawasumi et al. ......... 427/217 |
| 5,439,638 | A |   | 8/1995 | Houck et al. ................. 419/30 |
| 6,103,392 | A | * | 8/2000 | Dorfman et al. ............ 428/570 |

FOREIGN PATENT DOCUMENTS

JP          08-120310 A  *  5/1996

\* cited by examiner

*Primary Examiner*—George Wyszomierski
(74) *Attorney, Agent, or Firm*—Robert F. Clark

(57) ABSTRACT

An electrochemical displacement-deposition method for making composite metal powders is described. The method is carried out by combining tungsten or molybdenum metal particles with particles of silver oxide or copper oxide in an aqueous hydroxide solution. Heat is applied to the solution to cause the oxide particles to convert to silver or copper metal particles which are substantially adhered to the refractory metal particles. Unlike conventional methods, it is not necessary to heat the oxide powders to a very high temperature in a reducing atmosphere in order to form the composite metal powder.

22 Claims, 3 Drawing Sheets

ELECTROCHEMICAL DISPLACEMENT-DEPOSITION METHOD FOR MAKING COMPOSITE METAL POWDERS

CROSS REFERENCES TO RELATED APPLICATIONS

This application claims the benefit of U.S. Provisional Application No. 60/441,454, filed Jan. 21, 2003.

TECHNICAL FIELD

This invention relates to a method of making composite refractory metal powders. More particularly, this invention relates to a method of making tungsten-copper, molybdenum-copper, tungsten-silver and molybdenum-silver composite metal powders.

BACKGROUND ART

Due to their relatively high thermal conductivities, composite metal powders which contain refractory metals (e.g., W or Mo) in combination with high conductivity metals (e.g., Cu or Ag) are used in many diverse applications., such as, as heat sinks and electrical contacts for the electronics industry. Such composites have been made by a number of methods. For example in one method, known as infiltration, a shaped article formed from a sintered mass of tungsten or molybdenum particles is contacted with molten copper. As a result, copper is infiltrated into the voids and interstices between the sintered tungsten or molybdenum particles forming a composite. The disadvantage of the infiltration method is its inability to produce net shape parts. This requires the parts produced by infiltration to be machined into final shape, thereby greatly increasing complexity of manufacture and cost.

In another method which is described in U.S. Pat. No. 3,382,066, a powdery mixture of copper oxide particles and tungsten oxide particles is reduced in a hydrogen atmosphere, the reduced powder is mixed with a binder and the mixture so-obtained compacted and sintered.

In yet another method described in U.S. Pat. No. 5,439,638, a mixture of tungsten powder, copper oxide powder and optionally cobalt powder is milled in an aqueous medium to form a slurry. The liquid is removed from the slurry to form spherical, flowable agglomerates, and the agglomerates are subjected to a reducing atmosphere to form a flowable tungsten/copper composite powder.

A common disadvantage associated with these methods is the necessary reduction of one or more oxides at very high temperatures in hydrogen or other reducing atmospheres. In particular, methods involving the co-reduction of oxide powders involve extra processing steps thereby making them more complex and difficult to control. Accordingly, there is a need for a method of making these composites which is simpler and less expensive.

SUMMARY OF THE INVENTION

The present invention relates to a novel electrochemical displacement-deposition method to make composite metal powders. A principal advantage of the method of this invention is that no reduction in hydrogen or other reducing atmosphere is required to make the composite metal powder. The method is broadly applicable to making composite powders which preferably may contain from about 2 to about 60 weight percent (wt. %) of the conductive metal, e.g., Cu or Ag.

The method of this invention comprises combining particles of tungsten or molybdenum metal with particles of silver oxide or copper oxide in an aqueous hydroxide solution; and heating the solution to a temperature and for a time sufficient to convert the silver oxide or copper oxide particles to silver or copper metal particles, wherein the silver or copper metal particles are substantially adhered to the tungsten or molybdenum metal particles.

DETAILED DESCRIPTION OF THE INVENTION

Figure 1:
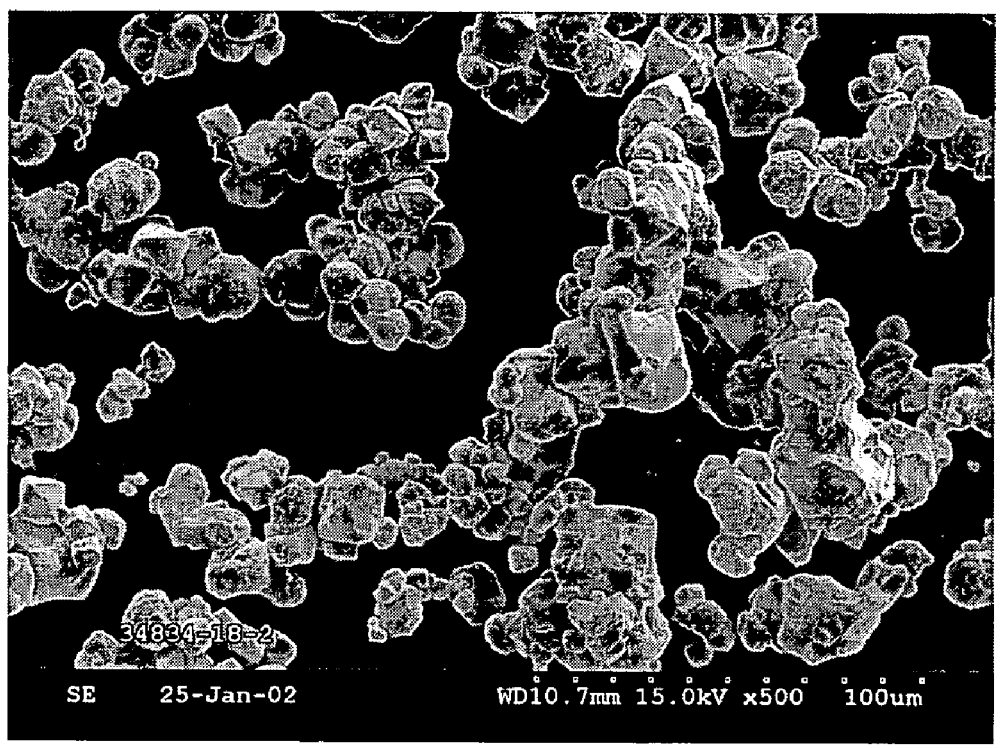
FIG. 1 is a scanning electron micrograph (SEM) of the tungsten-copper composite powder of Example 1.

For a better understanding of the present invention, together with other and further objects, advantages and capabilities thereof, reference is made to the following disclosure and appended claims taken in conjunction with the above-described drawings.

Electrochemical displacement-deposition reactions involve electrochemical precipitation and crystallization of a noble metal from a solution of its salt on a more electropositive metal which, in turn, progressively dissolves. For example, on the basis of following half cell reactions (Eqs. (i)–(iii)) copper ions can displace tungsten from a tungsten metal particle and deposit copper in place of the displaced tungsten. In particular, the displaced tungsten is dissolved as tungstate ions while copper ions would crystallize as copper metal. The overall electrochemical reaction (Eq. (iii)) indicates a positive resultant potential (0.33 V) at 25° C. This reaction can be carried out in a controlled manner with faster reaction rates at temperatures from about 60° C. to about 95° C.

| | Equations | |
|---|---|---|
| (i) | $6Cu(NH_3)_2^+ + 6e^- \rightarrow 6Cu + 12NH_3$ | (E = −0.72 V) |
| (ii) | $W + 6OH^- \rightarrow H_2WO_4 + 3H_2O + 6e^-$ | (E = 1.05 V) |
| (iii) | $6Cu(NH_3)_2^+ + W + 6OH^- \rightarrow$ $6Cu + (NH_4)_2WO_4 + 3H_2O + 10NH_3$ | (E = 0.33 V) |

We have discovered that an electrochemical displacement-deposition method can be used to make composite metal powders comprising W or Mo in combination with Cu or Ag. In a preferred embodiment, the method of this invention comprises forming a mixture of a tungsten or molybdenum metal particles (preferably having a Fisher Sub-Sieve Size (FSSS) of about 0.5 μm to about 30 μm) with particles of silver oxide or copper oxide (preferably, $Cu_2O$ or $Ag_2O$ having a FSSS size of about 1 μm to about 6 μm) in an aqueous hydroxide solution. Preferably, the hydroxide concentration ranges from about 1–15 M and may be formed with ammonium hydroxide or sodium hydroxide. More preferably, the hydroxide solution comprises 10–90% water and 90–10% 14.5 M ammonium hydroxide by volume and in one preferred embodiment the hydroxide solution is about 7 M ammonium hydroxide. The hydroxide solution is then heated to cause copper (or silver) metal to deposit on the tungsten (or molybdenum) particles. Preferably, the solution is heated to a temperature from about 60° C. to about 95° C. for about 10 minutes to about 5 hours to form the composite powder. The composite powder is separated by filtration, washed with water, and dried. Tungsten-copper, molybdenum-copper, tungsten-silver, and molybdenum-silver composite powders with a wide range of copper or silver content (preferably, about 2 wt. % to about 60 wt. %) can be made by this method.

It should be noted that the electrochemical reactions used in this invention are not typical electrochemical displacement (cementation) reactions. In a typical cementation reaction, tungsten (or molybdenum) particles are expected to be coated with copper (or silver). In addition, a typical cementation reaction involves the deposition of a dissolved species from the solution onto the metal particles. In the present invention, the reaction takes place directly from the solid oxide particles on the refractory metal particles via the dissolution of the oxide particles at the surface of the refractory metal particles.

To fully illustrate this invention, the following non-limiting examples are presented.

Preparation of Coarse W—Cu Composite Powders

EXAMPLE 1

A 6-gram amount of $Cu_2O$ was suspended in an aqueous solution containing 50 ml water and 50 ml 14.5 M ammonium hydroxide at 50° C. A 20-gram amount of tungsten metal powder (FSSS=14μ) was added into the suspension and the suspension was then heated to 75° C. The electrochemical reaction was quite rapid at 75° C. and was completed in few minutes. The solids were separated by filtration, washed with water and dried at 110° C. On the basis of XRD, SEM and XRF, the solids were characterized as tungsten-copper powder containing 18.8 wt. % Cu and 81.2 wt. % tungsten. FIG. 1 is a SEM photomicrograph of the resulting tungsten-copper composite powder. The copper particles are shown to be substantially adhered to the tungsten particles which verifies the electrochemical displacement-deposition mechanism. The morphology of the tungsten-copper composite powder was similar to the original W powder.

EXAMPLE 2

A 95-gram quantity of tungsten metal powder (FSSS=14μ) was mixed with 25 g $Cu_2O$ in a 500 ml polyethylene bottle. To this, 100 ml water and 100 ml 14.5 ammonium hydroxide were added and the powders were suspended by manually shaking the bottle. The suspension was heated in a temperature-controlled water bath with occasional shaking. The electrochemical reaction occurred at about 70–80° C. After reacting the mixed suspension at 80° C. for about ½ hour, 101 g of composite powder was obtained. The powder contained 18 wt. % Cu and 82 wt. % W.

Figure 2:
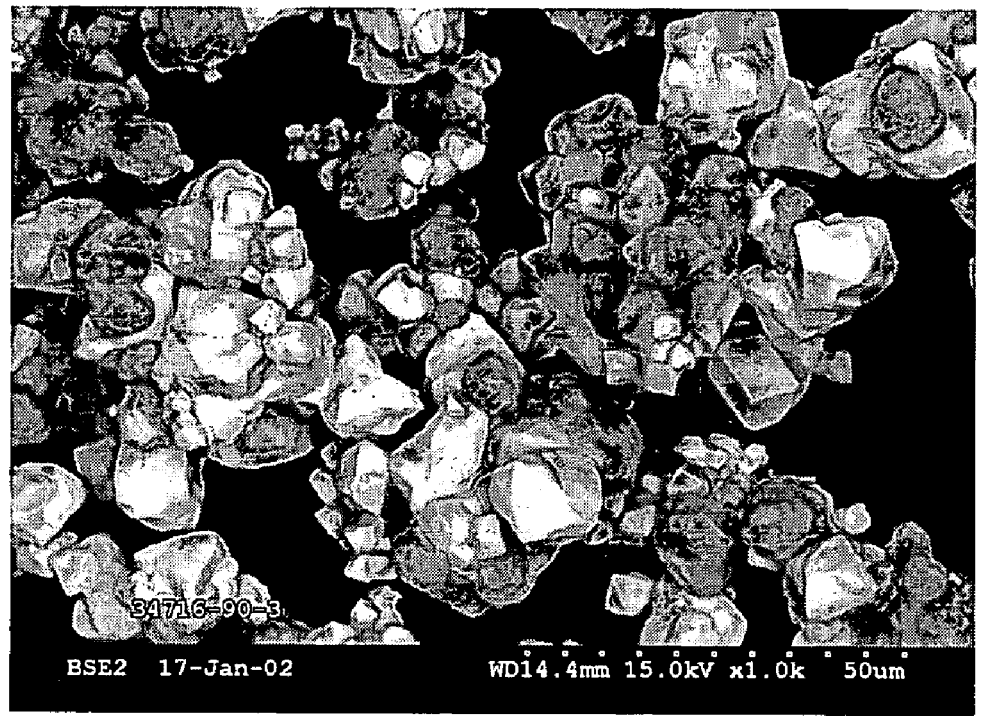
FIG. 2 is a back-scattered SEM of the tungsten-copper composite powder of Example 2.

The 25-gram amount of $Cu_2O$ contained 22.2 g Cu which according to the above equation will dissolve 10.7 g W. Theoretically this would form a tungsten-copper composite having 79.2 wt. % W and 20.8 wt. % Cu which compares favorable to the values obtained for the resultant composite powder. Analysis of supernate from the suspension indicated a loss of 10.5–11 g of tungsten to the solution. However, 3.5 g of copper were also found to have been lost to the solution, possibly due to the solubility of $Cu_2O$ in ammonium hydroxide. This accounts for the slightly lower than expected amount of copper in tungsten-copper composite. FIG. 2 is a back-scattered SEM of the composite powder and shows the copper particles (darker color) cemented to the tungsten particles (lighter color).

EXAMPLE 3

A 40-gram amount of tungsten metal powder (FSSS=14μ) was mixed with 6 g $Cu_2O$ (5.33 g Cu) in 100 ml water in a 1-L beaker. The contents were heated on a hot plate and agitated with a mixer. When the water started to boil, 100 ml of 14.5 M ammonium hydroxide were added. After the ammonium hydroxide addition, the temperature dropped to 60° C. When the temperature rose to 68–70° C., the reaction appeared to be completed. The solids were separated by filtration, washed with water, and dried at 110° C.

The solids were characterized as tungsten-copper composite powder containing 11.2 wt. % Cu and 88.8 wt. % tungsten which was again somewhat less than the theoretical value of 12.4 wt. % Cu and 87.6 wt. % W because some copper remained in solution.

EXAMPLE 4

The same method as in Example 2 was followed except that the suspension was heated first for 1 hour at 70° C. and then for 1 hour at 80° C. A total of 93 g of tungsten-copper powder was obtained which contained about 18 wt. % Cu and 82 wt. % W. The bulk density of the W—Cu composite powder at 4.4 g/cm$^3$ was comparable to the bulk density of original tungsten powder (4.5 g/cm$^3$) used in this example.

The resulting composite powder was pressed at a maximum 125 tons to form a 1.335"×1.335" sample. The green density of the pressed sample was comparable to the green density of a similar sample (sample 1) obtained by pressing a mixture Cu and W metal powders containing 1 wt. % Pb. However, the transverse rupture strength (ASTM B406-95) of the sample (sample 2) formed from the composite powder made according to the method of this invention was at least 3.4 times higher than the value obtained for mixed powders (Table 1).

TABLE 1

| Sample | Type | Green Density (g/cm$^3$) | TRS (psi) |
|---|---|---|---|
| 1 | 80 wt. % W + 19 wt. % Cu (mixed) + 1 wt. % Pb | 13.47 | 1,311 |
| 2 | 99 wt. % (18Cu—82W composite) + 1 wt. % Pb | 13.51 | 4,452 |

EXAMPLE 5

Figure 3:
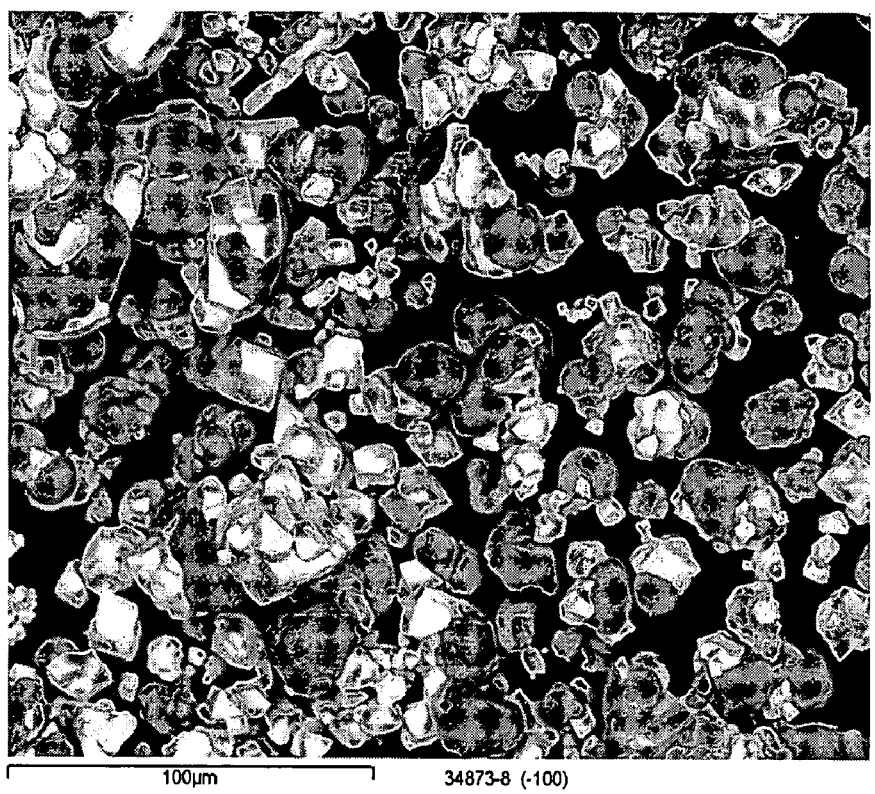
FIG. 3 is a back-scattered SEM of the tungsten-copper composite powder of Example 5

In a toll-slender reactor, a 250-ml volume of water and a 250-ml volume of 14.5 M ammonium hydroxide were combined and heated to 75° C. A 65.8-gram amount of $Cu_2O$ and a 250-gram amount of tungsten metal powder (FSSS=14 µm) were added while mixing. The suspension was heated at 75° C. for 1.5 hours. The solids, afterwards, were separated by filtration, washed with 500–1000 ml water, and dried at 110° C. In all, 10 batches were made and blended together to make about 6 lb of W—Cu composite powder. The powder contained 20.3% Cu and 79.7% W by weight. FIG. 3 is a back-scattered SEM of the composite powder and shows the copper particles (darker color) cemented to the tungsten particles (lighter color).

The resulting composite powder was pressed at a maximum 125 tons to form a 1.335"×1.335" sample. Two samples were prepared; sample #1 was pressed with 2 wt. % Pb and 98 wt. % of the 20.3Cu-79.7W composite, and sample #2 was pressed with only the 20.3Cu-79.7W composite. The green density and transverse rupture strength of the pressed samples were comparable as shown in Table 2.

TABLE 2

| Sample | Type | Green Density (g/cm$^3$) | TRS (psi) |
|---|---|---|---|
| 1 | 98 wt. % (20.3Cu—79.7W) composite + 2 wt. % Pb | 13.47 | 6,320 |
| 2 | 20.3Cu-79.7W composite (No additives) | 13.51 | 6,120 |

Preparation of Mixed Coarse and Fine W—Cu Composite Powders

EXAMPLE 6

Same procedure was followed as in Example 4 except the tungsten powder was a mixture of coarse and fine powders: 50 g (24.5–28.5 µm) and 45 g (1.5–1.8 µm). A total of 102 g of tungsten-copper powder was obtained. A very large TRS value of 4,978 psi was observed for the pressed green piece formed from the resultant W—Cu composite powder.

Preparation of Fine W—Cu Composite Powders

EXAMPLE 7

Figure 4:
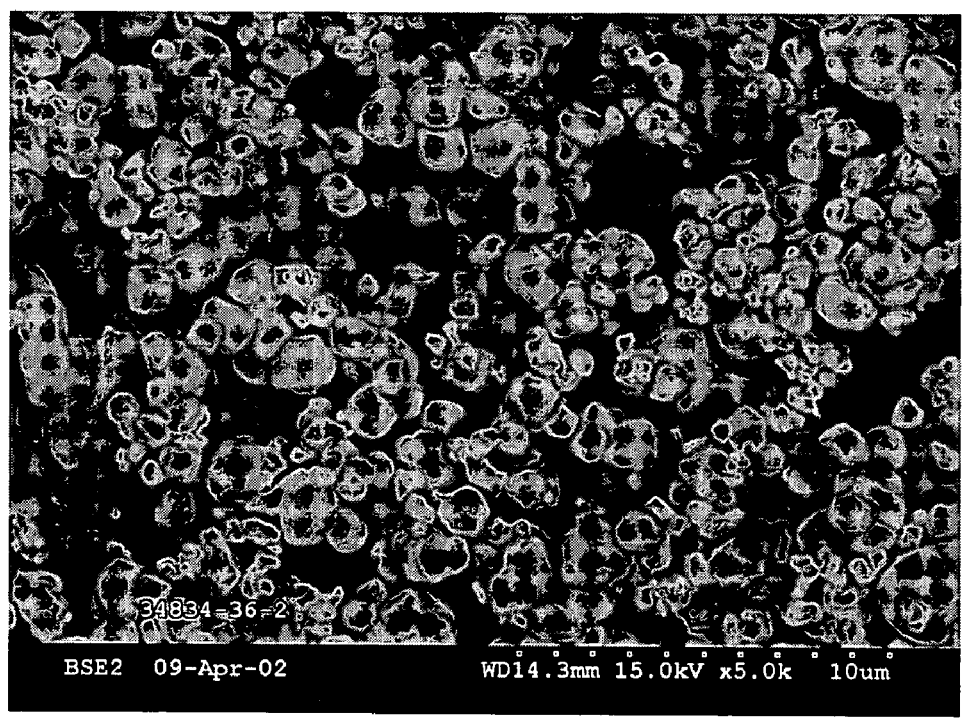
FIG. 4 is a back-scattered SEM of the tungsten-copper composite powder of Example 7.

A 100-gram amount of tungsten metal powder (FSSS=1.5–1.8 µm) was mixed with 15 g $Cu_2O$ in a 500 ml polyethylene bottle. A 100-ml volume of water and a 100-ml volume of 14.5 M ammonium hydroxide were added and the powders were suspended by manually shaking the bottle. The suspension was heated using a temperature-controlled water bath with occasional agitation. After heating the mixed suspension at 80° C. for about ½ hour, the solids were separated by filtration, washed with 500 ml water, and dried at 110° C. A total of 105.5 g of W—Cu composite powder were obtained. The powder contained 11.3% Cu and 88.5% W by weight. Bulk density was 3.08 g/cm$^3$. FIG. 4 is a back-scattered SEM of the resulting tungsten-copper powder. The copper particles (darker color) appear cemented to the tungsten particles (light color).

EXAMPLE 8

Figure 5:
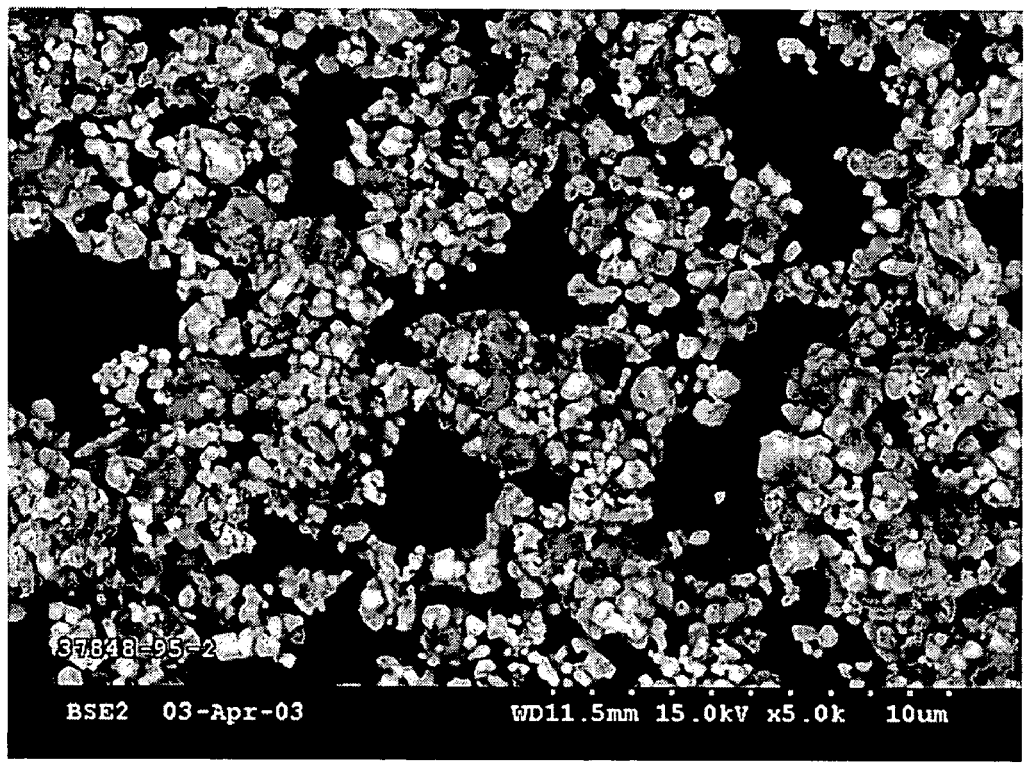
FIG. 5 is a back-scattered SEM of the tungsten-copper composite powder of Example 8.

The same procedure as in Example 2 was used except that the tungsten powder was a fine powder having an average size of 1.5–1.8 µm. A total of 103–105 g of W—Cu composite powder was obtained which contained 20 wt. % Cu and 80 wt. % W. FIG. 5 is back-scattered SEM of the resulting powder. The electrical conductivity of a pressed (45 Ksi) and sintered (at 1250° C. for 2 hour in sand) of a tungsten-copper piece made from the powder was 43.2% IACS. The density of the pressed piece was greater than 96% of the theoretical density. These properties demonstrate that the tungsten-copper composite powders made by the method of this invention are suitable for heat sink applications.

Preparation of Fine Mo—Cu Composite Powders

EXAMPLE 9

Figure 6:
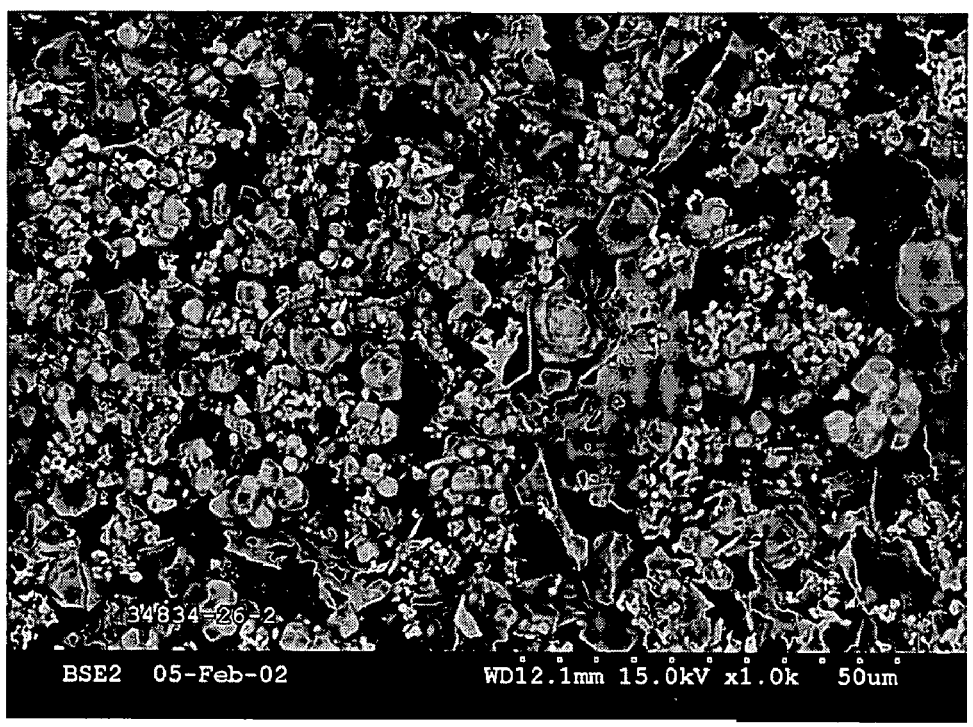
FIG. 6 is a back-scattered SEM of the molybdenum-copper composite powder of Example 9.

A 8.95-gram amount $Cu_2O$ and 11.2 grams of molybdenum metal powder (FSSS 3–4 µm) were suspended in 100 ml water and heated to a boil while agitating vigorously. Once boiling, 100 ml of 14.5 M ammonium hydroxide were added. The suspension was cooled down, reheated to 80° C. and then filtered. The solids were washed with water and dried at 110° C. A total of 18 g of Mo—Cu composite powder was obtained which contained about 55 wt. % Mo and 45 wt. % Cu. FIG. 6 is a back-scattered SEM of the composite powder and shows the copper particles (darker color) cemented to the molybdenum particles (light color).

EXAMPLE 10

A 51-g quantity of 1.1–1.7 µm molybdenum metal powder was mixed with 25 g $Cu_2O$ (22.2 g Cu) powder by sieving through a 100-mesh sieve. The mixture was transferred to a 500 ml polyethylene bottle and 100 ml water and 100 ml 14.5 M ammonium hydroxide were added. The solids were mixed well by manual shaking and then heated at about 80° C. for about 0.5 to 1 hour. The solids were separated by filtration, washed with water, and dried at 110° C. A total of 63 g of Mo—Cu composite powder, containing about 65 wt. % Mo and 35 wt. % Cu were obtained which compared well with the theoretical value of 33 wt. % Cu and 67 wt. % Mo. The Mo—Cu composite powder indicated a particle size (FSSS) of 2.18 µm and a porosity of 0.836.

Preparation of Sub-Micron Mo—Cu Composite Powders

EXAMPLE 11

A 7.4-g quantity of sub-micron molybdenum metal powder was mixed with 1.6 g $Cu_2O$ in 10 ml water and 10 ml 14.5 M ammonium hydroxide. The electrochemical reaction was carried out at 70–80° C. for 20–25 min. The solids were separated by filtration, washed with water, and dried at 110° C. The Mo—Cu composite powder contained about 14 wt. % Cu and 86 wt. % Mo.

Preparation of Fine W—Ag Composite Powders

EXAMPLE 12

A 22.32-g quantity of tungsten metal powder (FSSS=1.5–1.8 µm) was mixed with 5.13 g $Ag_2O$ in a 250 ml polyethylene bottle. The mixed powder was then suspended in 50 ml water and 50 ml 14.5 M ammonium hydroxide and heated at 80° C. for about ½ hour. The solids were separated by filtration, washed with 100 ml water, and dried at 110° C. A total of 25.5 g of W—Ag composite powder were obtained.

Preparation of Fine Mo—Ag Composite Powders

EXAMPLE 13

The same procedure as in Example 11 was used except that 11.6 g Mo powder (3–4 μm) was used in place of the W powder. A total of 15.2 g of Mo—Ag composite powder was obtained.

While there has been shown and described what are at the present considered the preferred embodiments of the invention, it will be obvious to those skilled in the art that various changes and modifications may be made therein without departing from the scope of the invention as defined by the appended claims.

We claim:

1. A method of making a composite metal powder comprising:
   (a) combining particles of tungsten or molybdenum metal with particles of silver oxide or copper oxide in an aqueous hydroxide solution;
   (b) heating the solution to a temperature and for a time sufficient to convert the silver oxide or copper oxide particles to silver or copper metal particles, said silver or copper metal particles being substantially adhered to the tungsten or molybdenum metal particles.

2. The method of claim 1 wherein the hydroxide solution has a hydroxide concentration from 1 to 15 M.

3. The method of claim 1 wherein the solution is heated to a temperature from about 60° C. to about 95° C.

4. The method of claim 3 wherein the hydroxide solution is an aqueous ammonium hydroxide solution.

5. The method of claim 4 wherein the aqueous ammonium hydroxide solution contains 10 to 90 percent water and 90 to 10 percent 14.5 M ammonium hydroxide by volume.

6. The method of claim 4 wherein the aqueous ammonium hydroxide solution has a concentration of about 7 M ammonium hydroxide.

7. The method of claim 4 wherein the solution is heated for about 10 minutes to about 5 hours.

8. The method of claim 7 wherein the aqueous ammonium hydroxide solution contains 10 to 90 percent water and 90 to 10 percent 14.5 M ammonium hydroxide by volume.

9. The method of claim 1 wherein the hydroxide solution is formed with ammonium hydroxide or sodium hydroxide.

10. The method of claim 1 wherein the composite metal powder has a silver or copper content of from 2 percent to 60 percent by weight.

11. A method of making a composite metal powder comprising:
   (a) combining particles of tungsten or molybdenum metal with particles of $Ag_2O$ or $Cu_2O$ in an aqueous hydroxide solution;
   (b) heating the solution to a temperature of from about 60° C. to about 95° C. for a time sufficient to convert the $Ag_2O$ or $Cu_2O$ particles to silver or copper metal particles, said silver or copper metal particles being substantially adhered to the tungsten or molybdenum metal particles.

12. The method of claim 11 wherein the aqueous hydroxide solution is formed with ammonium hydroxide or sodium hydroxide.

13. The method of claim 11 wherein the hydroxide solution has a hydroxide concentration from 1 to 15 M.

14. The method of claim 11 wherein the hydroxide solution is aqueous ammonium hydroxide.

15. The method of claim 14 wherein the aqueous ammonium hydroxide solution contains 10 to 90 percent water and 90 to 10 percent 14.5 M ammonium hydroxide by volume.

16. The method of claim 14 wherein the aqueous ammonium hydroxide solution has a concentration of about 7 M ammonium hydroxide.

17. The method of claim 14 wherein the solution is heated for about 10 minutes to about 5 hours.

18. The method of claim 17 wherein the aqueous ammonium hydroxide solution has a concentration of about 7 M ammonium hydroxide.

19. The method of claim 11 wherein the tungsten or molybdenum metal particles have a FSSS size of from about 0.5 μm to about 30 μm and the $Ag_2O$ or $Cu_2O$ particles have a FSSS size of from about 1 μm to about 6 μm.

20. The method of claim 11 wherein the composite metal powder has a silver or copper content of from 2 percent to 60 percent by weight.

21. A method of making a composite metal powder comprising:
   (a) combining particles of tungsten or molybdenum metal with particles of $Ag_2O$ or $Cu_2O$ in an aqueous ammonium hydroxide solution, the tungsten or molybdenum metal particles having a FSSS size of from about 0.5 μm to about 30 μm and the $Ag_2O$ or $Cu_2O$ particles having a FSSS size of from about 1 μm to about 6 μm;
   (b) heating the solution to a temperature of from about 60° C. to about 95° C. for about 10 minutes to about 5 hours to convert the $Ag_2O$ or $Cu_2O$ particles to silver or copper metal particles, said silver or copper metal particles being substantially adhered to the tungsten or molybdenum metal particles and the composite metal powder having a silver or copper content of from 2 percent to 60 percent by weight.

22. The method of claim 21 wherein the aqueous ammonium hydroxide solution has a concentration of about 7 M ammonium hydroxide.

* * * * *